United States Patent
Gunda et al.

(10) Patent No.: US 7,461,315 B2
(45) Date of Patent: Dec. 2, 2008

(54) METHOD AND SYSTEM FOR IMPROVING QUALITY OF A CIRCUIT THROUGH NON-FUNCTIONAL TEST PATTERN IDENTIFICATION

(75) Inventors: Arun Gunda, San Jose, CA (US); Narendra Devta-Prasanna, Bangalore (IN)

(73) Assignee: LSI Corporation, Milpitas, CA (US)

( * ) Notice: Subject to any disclaimer, the term of this patent is extended or adjusted under 35 U.S.C. 154(b) by 550 days.

(21) Appl. No.: 11/124,649

(22) Filed: May 9, 2005

(65) Prior Publication Data

US 2006/0253751 A1 Nov. 9, 2006

(51) Int. Cl.
*G01R 31/28* (2006.01)
(52) U.S. Cl. .................................................... 714/738
(58) Field of Classification Search .................. 714/738
See application file for complete search history.

(56) References Cited

U.S. PATENT DOCUMENTS

| | | | |
|---|---|---|---|
| 6,247,154 B1 * | 6/2001 | Bushnell et al. | 714/733 |
| 6,651,227 B2 * | 11/2003 | Abadir et al. | 716/4 |
| 6,707,313 B1 * | 3/2004 | Rohrbaugh et al. | 324/765 |
| 6,708,139 B2 * | 3/2004 | Rearick et al. | 702/185 |
| 7,131,081 B2 * | 10/2006 | Wang et al. | 716/4 |
| 7,249,300 B2 * | 7/2007 | Chung et al. | 714/726 |
| 2005/0138509 A1 * | 6/2005 | Kiryu et al. | 714/726 |
| 2005/0240887 A1 * | 10/2005 | Rajski et al. | 716/4 |

* cited by examiner

*Primary Examiner*—James C Kerveros
(74) *Attorney, Agent, or Firm*—Suiter Swantz PC LLO

(57) ABSTRACT

The present invention is directed to a system and method for quality improvement by identifying test patterns for DFT logic faults and functional logic faults. The identified test patterns may be selectively utilized for pruning of patterns or DPM estimation. Functional faults and DFT faults may be identified from detected TDF faults. The functional faults are faults on a logic which was present in a pre-test insertion net list. Remaining faults are the DFT faults. A set of test patterns for DFT faults may be utilized as the first target for the pattern truncation which will reduce the amount of test patterns to be tested. A set of test patterns for functional may be utilized for improving the TDF coverage.

18 Claims, 1 Drawing Sheet

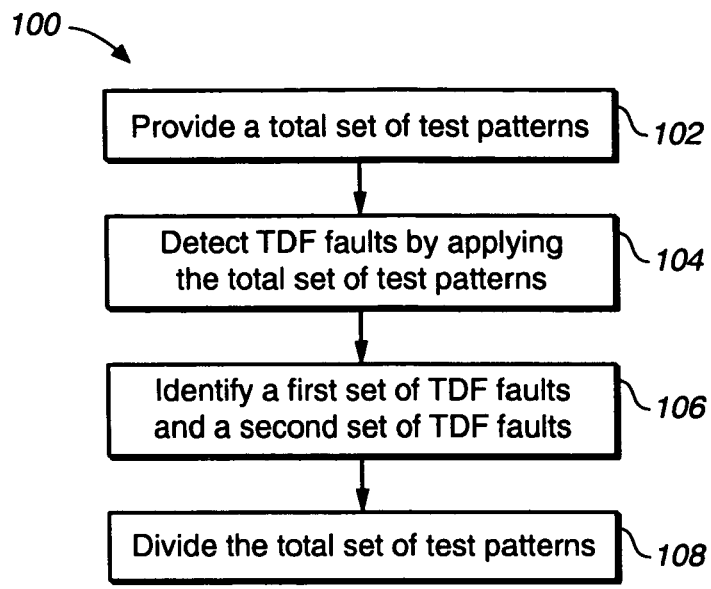
FIG._1
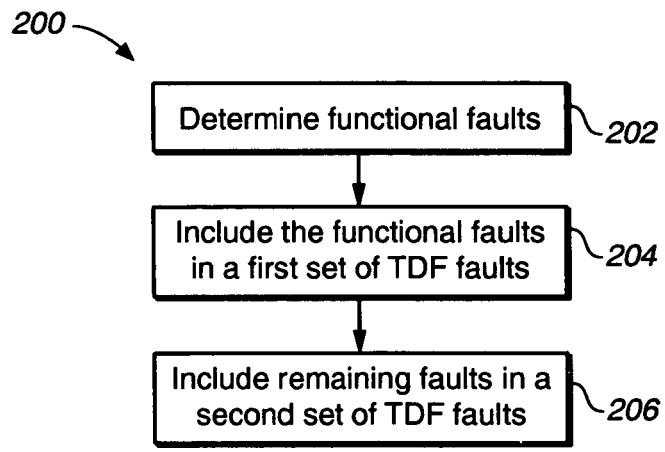
FIG._2
|  | SAS Test Coverage | TDF Test Coverage |
|---|---|---|
| Functional Logic | 99.27% | 91.96% |
| DFT Logic | 92.38% | 63.55% |
| Total | 97.60% | 85.25% |
FIG._3

METHOD AND SYSTEM FOR IMPROVING QUALITY OF A CIRCUIT THROUGH NON-FUNCTIONAL TEST PATTERN IDENTIFICATION

FIELD OF THE INVENTION

The present invention generally relates to the field of integrated circuits, and particularly to a system and method for identifying transition delay fault pattern in order to improve the quality of integrated circuits (ICs).

BACKGROUND OF THE INVENTION

As integrated circuits are produced with greater and greater levels of circuit density, efficient testing schemes that guarantee very high fault coverage while minimizing test costs and chip area overhead have become essential. Particularly, verifying at-speed performance of integrated circuits is important to ensure a satisfactory shipped part quality level (SPQL). In past, at-speed performance of integrated circuits was typically verified using functional tests. However, as the complexity and density of circuits continues to increase, high fault coverage of several types of fault models becomes more difficult to achieve with traditional testing paradigms. For example, it is not feasible to develop functional tests for today's multi-million gate designs to achieve satisfactory defect coverage due to the prohibitive cost of such development. Conventionally, the scan-based delay testing approach is used as a low-cost alternative to functional testing for verifying at-speed performance of integrated circuits.

Timing failures caused by delays may result in circuitry logic failure and eventually lead to a system failure. Thus, in the scan-based delay testing approach, performance failures are modeled as delay-causing faults and test patterns are generated by an automatic test pattern generator (ATPG).

Transition delay fault and path delay fault models are known to provide a good coverage of delay-causing faults. The transition delay fault (TDF) model targets every node in the design for a slow-to-rise and a slow-to-fall delay fault whereas the path delay fault model targets the cumulative delay through paths in the circuit. The TDF model is commonly used in the industry since it is simple and existing ATPG algorithms can be easily adapted to generate tests for TDF faults.

One of the challenges faced by several companies in the industry is the increased cost of TDF testing because the TDF model requires a large number of patterns and a large amount of scan memory. Some companies have adopted truncation of patterns to reduce the number of patterns and testing cost. However, the truncation of pattern may have a few drawbacks. For example, it may affect quality of ICs. The quality of ICs can be measured in many ways, but in general it is represented as the number of defective parts per the number of units shipped. Typically, the quality of ICs manufacturing is measured in terms of yield. 97% yield may indicate that 3% of ICs are defective and 97% of ICs are non-defective. Additionally, the quality of ICs may be represented by Defect Per Million (DPM) which is a measure of how many malfunctioned ICs are incorrectly found to be as functioned ICs due to the TDF tester inaccuracy. It is known to the art that the truncation of pattern may result in increased DPM and/or poor yield, which is an indirect cost to customers.

Therefore, it would be desirable to provide a method and system for pruning test patterns to reduce number of test patterns and test costs while it does not compromise the quality of ICs.

SUMMARY OF THE INVENTION

Accordingly, the present invention provides a system and method for quality improvement by identifying test patterns for DFT logic faults and functional logic faults. The identified test patterns may be selectively utilized for pruning of patterns or DPM estimation.

In an exemplary aspect of the present invention, a method for identifying non-functional and functional test patterns for their selective use is provided. A total set of test patterns is provided. TDF faults for the total set of test patterns are detected through various TDF test approaches which include a broadside test approach and a skewed-load test approach. A first set of TDF faults and a second set of TDF faults may be identified from the detected TDF faults. First, functional faults are identified. The functional faults are faults on a logic which was present in a pre-test insertion net list. The functional faults are included in the first set of TDF faults. Remaining faults from the detected TDF faults are included in the second set of TDF faults. The remaining faults are faults on a DFT logic which was inserted to aid in testing. A first set of test patterns for the first set of TDF faults and a second set of test patterns for the second set of TDF faults may be divided.

In additional exemplary aspect of the present invention, the second set of test patterns may be utilized as the first target for the pattern truncation. The pattern truncation is utilized to reduce number of test patterns to be tested. The second set of test patterns is to screen TDF faults on DFT logic. The DFT logic may be inserted in order to aid testing but not exercised by customers. Thus, if the total pattern set does not fit on a tester, the second set of test patterns may be pruned (truncated) in order not to impact the quality of the circuit. The first set of test patterns may be utilized for improving TDF coverage and DPM calculation.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a flow diagram of a method implemented in accordance with an exemplary embodiment of the present invention;

FIG. 2 is a flow diagram of a method for identifying test patterns in accordance with an exemplary embodiment of the present invention; and FIG. 3 illustrates a table of experimental data in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

Design-for testability (DFT) for sequential circuits allows test patterns to be generated and applied to a circuit through use of DFT logic. The generated test patterns may not be applicable to the circuit without DFT logic. Such tests use non-functional operation of the circuit, enabled by DFT logic, to detect faults. It is well known to the art that faults detected during non-functional operation may not affect the functional operation of the circuit. Moreover, if a fault can only be detected during non-functional operation, the fault is undetectable or possibly even redundant. Detection of such a fault may cause unnecessary yield loss.

DFT logic is typically inserted to aid in testing. Consequently, most of the DFT logic in testing are tied off a customer functional flow and are not switching on the board and may not affect the functional operation of the circuit. As such, TDF faults on DFT logic are faults detected during non-functional operation, which may not affect the functional operation of the circuit.

Referring now to FIG. 1, a flow diagram of a method 100 implemented in accordance with an exemplary embodiment of the present invention is shown. The method 100 may include steps as follows. In Step 102, a total set of test patterns for a circuit is provided. It is to be noted that test patterns can be generated by various pattern generators which may be a device, an application, module or subsystem of testers. The test patterns may be generated by any commercially available ATPGs. A tester may be configured to detect delay faults through applying the total set of test patterns. In a preferred embodiment, the tester may be capable of detecting delay faults using transition delay fault (TDF) model testing. The TDF model testing targets every node in the design for a slow-to-rise and a slow-to-fall delay fault. The TDF model is commonly used in the industry since it is simple and existing ATPG algorithms can be easily adapted to generate tests for TDF faults. In Step 104, TDF faults for the total set of test patterns may be detected through a transition delay fault method. It will be appreciated that there are various TDF model testing methods. Examples of TDF model testing methods include a broadside testing method, a skew-load testing method, and the like. It is contemplated that any transition delay fault method may be suitable for applying the total set of test patterns to detect the TDF faults.

A first set of TDF faults and a second set of TDF faults may be identified from the TDF faults in Step 104. The first set of TDF faults includes Functional faults and the second set of TDF faults includes DFT faults. The Functional faults may be detected faults on the functional logic and DFT faults may be detected faults on the DFT logic. In Step 106, the total set of tests patterns is divided into two subsets based on the first set of TDF faults and the second set of TDF faults. The two subsets include a first subset of the test patterns (Functional patterns) which are designed to test functional logic and a second subset of the test patterns (DFT patterns) which are designed to test non-functional logic (such as DFT logic, and the like). It is to be noted that test patterns which are designed to test non-functional logic will not be exercised by customers. As such the second subset of test patterns is for DFT logic which will not be exercised by customers. Thus, the TDF coverage improvement on DFT logic may not improve the quality of ICs which are to be shipped to customers. On the other hand, the TDF improvement on Functional logic may improve the quality of ICs and it directly correlates to decrease in DPM.

FIG. 2 shows a flow diagram of a method for implementing test pattern identification in accordance with an embodiment of the present invention. In Step 202, the Functional faults are selected from the TDF faults detected for the total set of test patterns. In an embodiment, the functional faults may be defined as detected faults on the logic that was present in the pre-test insertion net list. The pre-test insertion net list is a net list before any DFT logic was inserted. As described above, Design-for Testability (DFT) for sequential circuits allows test patterns to be generated and applied to a circuit through use of DFT logic. The generated test patterns may not be applicable to the circuit without DFT logic. However, DFT logic may not affect the functional operation of the circuit. In Step 204, the selected functional faults may be included into the first set of TDF faults. Remaining faults from the TDF faults may be classified as DFT faults and included into to the second set of TDF faults in Step 206.

As shown in FIG. 3, when an exemplary industrial design test case is applied for a fault analysis, TDF coverage is typically 10-15% lower than Stuck at fault coverage. Moreover, TDF coverage on functional logic is generally higher than overall TDF coverage. There are various reasons why TDF coverage on functional logic is generally higher than overall TDF coverage. One of the reasons may be low TDF coverage on non-functional logic which offsets TDF coverage on functional logic. For example, TDF coverage on DFT logic is 63.55% while TDF coverage is 91.33% and overall TDF coverage is 85.25% as shown in FIG. 3. Although TDF coverage on the DFT logic is low, it is to be noted that it may not be a priority to focus efforts in improving TDF coverage on the DFT logic. As discussed above, the DFT logic is non-functional logic which is inserted to aid in testing. Thus, improving TDF coverage on the DFT logic may not improve the quality of ICs being shipped to customers since it may not result in low DPM or high yield. In contrary, improving TDF coverage on the Functional logic may improve the quality of ICs. It is contemplated that the Functional TDF coverage may represent close to true TDF coverage instead of overall TDF coverage in terms of DPM calculation. Accordingly, the Functional TDF coverage may provide a better DPM prediction than the overall TDF coverage.

The present invention may provide numerous advantages. It is known to the art that the pruning of pattern in order to reduce number of the total set of test patterns may result in increased DPM and/or poor yield, which is an indirect cost to customers. In the present invention may utilize the test patterns generated to cover the DFT logic to be the first order of target patterns to be pruned when the total pattern set does not fit on the tester. In this manner, the quality of ICs will not be compromised by pruning of test patterns. Additionally, DFT logic test patterns may be utilized for quality (e.g., yield and/or DPM) improvement even if the total pattern count fits the tester capacity. Under a conventional scheme used to prune test patterns has a direct correlation to DPM. For example, the pruning scheme increases X % of DPM when 1% of a total set of test patterns have been pruned. In the same example, when the test patterns generated to cover the DFT logic is 5.5% of the total set of test patterns and the total set of test pattern is to be truncated (pruned) by 5%, if 5% of test patterns selected randomly from the total set of test patterns are pruned, it will increase DPM 5 times of X %. However, there may be almost no impact on DPM if the 5% of test patterns being pruned are from DFT test patterns.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for selective use of test patterns, comprising steps of:
   providing a total set of test patterns for a circuit;
   detecting transition delay fault (TDF) faults by applying the total set of test patterns;
   identifying a first set of TDF faults and a second set of TDF faults from the TDF faults; and
   dividing the total set of test patterns into a first set of test patterns designed to test functional logic and a second set of test patterns designed to test non-functional logic based on the first set of TDF faults and the second set of TDF faults,
   wherein the first set of test patterns is utilized to improve TDF coverage and the second set of test patterns is the first order of test patterns to be pruned if the total set of test patterns fail to fit on a tester.

2. The method as described in claim 1, the identifying step further comprising:
   selecting functional faults from the TDF faults;
   including the functional faults in the first set of TDF faults; and
   including remaining faults from the TDF faults in the second set of TDF faults.

3. The method as described in claim 2, wherein the functional faults are detected faults on a logic present in a pre-test insertion net list.

4. The method as described in claim 2, wherein the remaining faults are detected faults on design-for testability (DFT) logic.

5. The method as described in claim 1, wherein the first set of test patterns is utilized to estimate a functional TDF coverage.

6. The method as described in claim 5, wherein the functional TDF coverage is utilized for defect per million (DPM) calculation.

7. The method as described in claim 1, wherein the total set of test patterns is applied through a broadside test model.

8. The method as described in claim 1, wherein the total set of test patterns is applied through a skewed-load test model.

9. A computer readable medium containing program instructions for providing quality improvement through selective use of TDF test patterns, the program instructions comprising:
   providing TDF faults on the TDF test patterns for a circuit;
   identifying functional faults from the TDF faults;
   including the functional faults in a first set of TDF faults;
   including remaining faults from the TDF faults in a second set of TDF faults; and
   separating a first set of test patterns designed to test functional logic for the first set of TDF faults and a second set of test patterns designed to test non-functional logic for the second set of TDF faults from the TDF test patterns,
   wherein the second set of test patterns is pruned first if a total of the first set of test patterns and the second set of test patterns fail to fit on a tester.

10. The computer readable medium as described in claim 9, wherein the functional faults are faults on a logic present in a pre-test insertion net list.

11. The computer readable medium as described in claim 9, wherein the remaining faults are non-functional faults on DFT logic which was inserted to aid in testing.

12. The computer readable medium as described in claim 9, wherein the second set of test patterns is pruned to reduce number of test patterns.

13. The computer readable medium as described in claim 9, wherein the first set of TDF faults is utilized to increase TDF coverage.

14. The computer readable medium as described in claim 13, wherein the first set of TDF faults is utilized for DPM calculation.

15. A method for providing quality improvement in ICs, comprising steps of:
   providing a first net list of a circuit;
   providing a second net list of the circuit;
   providing test patterns generated for detecting TDF faults;
   detecting TDF faults through applying the test patterns;
   identifying a first set of test patterns designed to test functional logic and a second set of test patterns designed to test non-functional logic;
   utilizing the first set of test patterns to improve TDF coverage; and
   pruning the second set of test patterns first for yield improvement,
   wherein the first net list is a pre-test insertion net list and the second net list is a post-test insertion net list.

16. The method as described in claim 15, the identifying step further comprising:
   selecting functional faults from the TDF faults;
   including the functional faults in a first set of TDF faults; and
   including remaining faults from the TDF faults in a second set of TDF faults; and
   separating the first set of test patterns based on the first set of TDF faults and the second set of test patterns based on the second set of TDF faults from the test patterns
   wherein the functional faults are faults on a logic which was present in the first net list and the second net list.

17. The method as described in claim 15, wherein the TDF faults are detected through a broadside test method.

18. The method as described in claim 15, wherein the TDF faults are detected through a skewed-load test method.

* * * * *